United States Patent
Cargill et al.

(10) Patent No.: US 10,623,852 B2
(45) Date of Patent: Apr. 14, 2020

(54) MEMS DEVICES AND PROCESSES

(71) Applicant: Cirrus Logic International Semiconductor Ltd., Edinburgh (GB)

(72) Inventors: Scott Lyall Cargill, Edinburgh (GB); Timothy John Brosnihan, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/150,591

(22) Filed: Oct. 3, 2018

(65) Prior Publication Data

US 2019/0110126 A1 Apr. 11, 2019

Related U.S. Application Data

(60) Provisional application No. 62/568,447, filed on Oct. 5, 2017.

(30) Foreign Application Priority Data

Oct. 19, 2017 (GB) .................................. 1717173.7

(51) Int. Cl.
| | |
|---|---|
| H04R 1/34 | (2006.01) |
| B81B 3/00 | (2006.01) |
| H04R 19/00 | (2006.01) |
| H04R 31/00 | (2006.01) |
| H04R 19/04 | (2006.01) |

(52) U.S. Cl.
CPC ........... *H04R 1/342* (2013.01); *B81B 3/0021* (2013.01); *B81B 3/0078* (2013.01); *H04R 19/005* (2013.01); *H04R 31/00* (2013.01); *B81B 2201/0257* (2013.01); *B81B 2203/0127* (2013.01); *H04R 19/04* (2013.01); *H04R 2201/003* (2013.01); *H04R 2499/11* (2013.01)

(58) Field of Classification Search
CPC combination set(s) only.
See application file for complete search history.

(56) References Cited

U.S. PATENT DOCUMENTS

| | | | |
|---|---|---|---|
| 6,535,460 B2* | 3/2003 | Loeppert | B81B 3/0072 367/181 |
| 7,381,589 B2* | 6/2008 | Minervini | H04R 1/04 438/113 |
| 8,803,257 B2* | 8/2014 | Kasai | B81B 3/007 257/415 |
| 9,820,025 B2* | 11/2017 | Hoekstra | H04R 19/005 |

(Continued)

FOREIGN PATENT DOCUMENTS

| | | |
|---|---|---|
| CN | 104980860 A | 10/2015 |
| EP | 2328361 A1 | 6/2011 |

(Continued)

OTHER PUBLICATIONS

Combined Search and Examination Report under Sections 17 and 18(3), UKIPO, Application No. GB1717173.7, dated Apr. 17, 2018.

*Primary Examiner* — Oyesola C Ojo
(74) *Attorney, Agent, or Firm* — Jackson Walker L.L.P.

(57) ABSTRACT

The application relates to MEMS transducers comprising at least one support structure for connecting a backplate structure of the transducer with an underlying substrate. A strengthening portion is provided in the region of the support structure.

16 Claims, 10 Drawing Sheets

(56) References Cited

U.S. PATENT DOCUMENTS

| | | | |
|---|---|---|---|
| 2002/0067663 A1* | 6/2002 | Loeppert | B81B 3/0072 |
| | | | 367/181 |
| 2011/0140213 A1* | 6/2011 | Kasia | B81B 3/007 |
| | | | 257/416 |
| 2012/0327092 A1* | 12/2012 | Sasagawa | B81B 7/0058 |
| | | | 345/501 |
| 2014/0084396 A1* | 3/2014 | Jenkins | B81B 3/0021 |
| | | | 257/419 |
| 2016/0340173 A1* | 11/2016 | Klein | H04R 31/006 |
| 2019/0047849 A1* | 2/2019 | Park | H01L 21/02518 |

FOREIGN PATENT DOCUMENTS

| | | |
|---|---|---|
| GB | 2453105 B | 1/2011 |
| GB | 2506173 A | 3/2014 |
| WO | 01/65303 A1 | 9/2001 |
| WO | 2014121955 A1 | 8/2014 |

\* cited by examiner

MEMS DEVICES AND PROCESSES

TECHNICAL FIELD

This application relates to micro-electro-mechanical system (MEMS) devices and processes, and in particular to a MEMS device and process relating to a transducer, for example a capacitive microphone.

BACKGROUND INFORMATION

MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

FIGS. 1 and 2 show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the backplate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110. A plurality of holes, hereinafter referred to as bleed holes 111, connect the first cavity 109 and the second cavity 110.

A plurality of acoustic holes 112 are arranged in the back-plate 104 so as to allow free movement of air molecules through the back plate, such that the second cavity 110 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 104 forms part of the back-volume which is typically enclosed by some other structure, such as a suitable package.

It should also be noted that whilst FIGS. 1 and 2 show the backplate being supported on the opposite side of the membrane to the substrate, arrangements are known where the backplate is formed closest to the substrate with the membrane layer supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown).

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane.

The backplate layer may also be formed of a dielectric material and may be conveniently formed of the same material as the membrane layer e.g. silicon nitride. The backplate supports a backplate electrode and acts as a fixed reference against which the displacement of the membrane and membrane electrode varies. Therefore, the backplate should be rigid and so is typically formed of a thicker layer of dielectric material than the membrane.

The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

The backplate electrode—which is typically a thin layer of metal e.g. aluminium—is usually embedded within the backplate structure. Thus, the backplate may be formed of a plurality of backplate layers wherein a metal layer which forms the backplate electrode is sandwiched between two adjacent layers.

FIG. 3 shows a simplified cross-sectional view of a conventional MEMS device such as that shown in FIGS. 1 and 2. The backplate 4 comprises a raised portion 4a—which extends in a plane overlying the upper surface of the substrate 5 will typically comprise the acoustic holes— and a sidewall portion 4b which extends between a plane at or close to an upper surface of the substrate (depending on the particular design and whether the membrane layer extends over the region where the sidewall of the baseplate will otherwise land on the top surface of the substrate) and the plane of the raised portion. As mentioned above, both the back-plate 4 and the membrane 1 may be formed from silicon nitride, for example, and the substrate from silicon. However, the thermal expansion coefficient of silicon is greater than that of silicon nitride and this may lead to stresses at the interface between the two dissimilar materials.

The structure of FIG. 3 is formed by various processes of depositing layers and then selectively dry or wet etching portions of the layers away again. These processes take place at relatively low temperatures (in the order of 10-400° C.). When the layers are deposited, there are no intrinsic stress concentrations in the structure. When the structure is released by removal of the sacrificial layers the tensile stress of the deposited layer causes a torsional moment in the membrane sidewall. This leads to a tensile stress concentration on the outer sidewall edge and a compressive stress concentration on the inner sidewall edge. A similar stress can be found in the membrane 1.

These stress concentrations tend to cause cracking originating at the points labelled A and B in FIG. 3, and can potentially lead to failure of the MEMS device. This stress can also render the MEMS device more susceptible to failure during fabrication. For example, when multiple MEMS devices are fabricated on a single wafer and subsequently separated using a technique known as singulation or dicing, the stress at points A and B can cause the device to crack and fail.

In a previous application by the same Applicant, and as illustrated in FIG. 4a, a MEMS transducer has been proposed in which one or more columns 216 are formed which serve to connect the backplate 204, or the backplate and the membrane 201, to the substrate 205. The columns are typically formed around the periphery of the backplate. As shown in FIG. 4a, the columns are provided in a region inside the sidewall portion 204b of the backplate within a region overlying the substrate 205 (i.e. in a region laterally outside the region overlying the substrate cavity).

Although the provision of columns has proved to be effective at increasing the rigidity of the backplate structure and, thus, alleviating stresses arising e.g. at interfacial surfaces where the sidewall of the backplate makes contact with the substrate (either directly or via one or layers provided on top of the substrate), there is a need to further reduce stresses arising in the backplate structure of a MEMS transducer.

Example embodiments described herein are generally concerned with improving the efficiency and/or performance of a MEMS transducer structure. In particular, example embodiments described herein relate to MEMS transducers and processes which seek to alleviate stresses arising within the backplate structure and/or which seek to enhance the rigidity of backplate structures.

SUMMARY OF EMBODIMENTS

According to an example embodiment of a first aspect there is provided a MEMS transducer comprising:
  a substrate;
  a backplate structure comprising a raised portion provided in a plane above the substrate;
  at least one support structure which connects the backplate structure and the substrate; and
  a strengthening portion provided on or within the support structure.

The support structure, which may in some senses be considered to form a column or pillar structure may comprise a depression formed in the raised portion of the backplate structure. The depression causes the lower surface of the backplate to connect the upper surface of the substrate, either directly or via one or more layers provided intermediate to the backplate and the substrate. The support structure may comprise a first part and a second part, wherein the first part comprises a portion of the backplate structure, and the second part which comprises a void region of the depression.

The strengthening portion may be provided on an upper surface of backplate structure in the region of the depression and may be conformal to the upper surface of the backplate structure in the region of the depression (conformal type). Alternatively, rather than being a conformal strengthening portion, the strengthening portion may be considered to be a plug strengthening portion which is provided to substantially fill the depression formed in the raised portion of the backplate structure (plug type).

The strengthening portion may be embedded within the backplate structure. For example, it will be appreciated that the backplate structure may be formed of a plurality of backplate layers. In this case the support structure may be defined by a plurality of backplate layers which define a depression within the backplate structure. Thus, the strengthening portion may be provided between adjacent backplate layers. In this case, the strengthening portion may be provided conformally with the upper surface of an underlying backplate layer. Alternatively, the strengthening portion may be provided so as to substantially fill or plug a void formed in the underlying backplate layer. Furthermore, the overlying backplate layer may be provided conformally with the strengthening portion (which may be conformal type or plug type).

The strengthening portion may extend into a region laterally surrounding the region of the support structure. The support structure is typically provided at the periphery of a membrane layer. The strengthening portion can be considered to be provided in the region of the support structure. Considering the lateral extent of the strengthening portion—for example when considering the extent of the strengthening portion when projected onto the plane of the membrane in a direction normal to the membrane—it will be appreciated that the strengthening portion will typically be provided between an outer boundary defined by the sidewall of the backplate and an inner boundary defined by the substrate cavity. However, in some examples the support structure and/or the strengthening portion may extend a small distance beyond the edge of the substrate cavity. Preferably, the strengthening portion does not extend over a central region of the substrate cavity so as to partially overlie the substrate cavity.

The transducer may comprise a membrane layer supported relative to the substrate so as to define a flexible membrane region, the membrane layer being provided between the backplate structure and the substrate. The first part of the support structure may comprises a portion of the membrane layer. Thus, a portion of the membrane layer that is "pinned" between the lower surface of a depression formed in the backplate structure and which connects the backplate structure to the upper surface of the substrate, can be considered to form a part of the resultant support structure or column. The transducer may comprise a membrane electrode supported by the flexible membrane region of the membrane layer.

The membrane layer may comprise an active region and a plurality of inactive regions. The support structure may be provided at an active region of the membrane or at an inactive region of the membrane.

The backplate structure may comprise a plurality of acoustic holes. A backplate electrode may be provided which is supported by the backplate structure. The backplate electrode may be embedded within the backplate structure, for example between adjacent layers of a multi-layer backplate structure. The material forming the backplate electrode, which may be metal, may form a layer within the support structure.

Features of any given aspect may be combined with the features of any other aspect and the various features described herein may be implemented in any combination in a given embodiment.

Associated methods of fabricating a MEMS transducer are provided for each of the above aspects.

BRIEF DESCRIPTION OF THE DRAWINGS

For a better understanding of the present invention, and to show how it may be put into effect, reference will now be made, by way of example to the accompanying drawings, in which.

It will be appreciated that the drawings may not be to scale and are for the purpose of illustration only.

Figure 1:
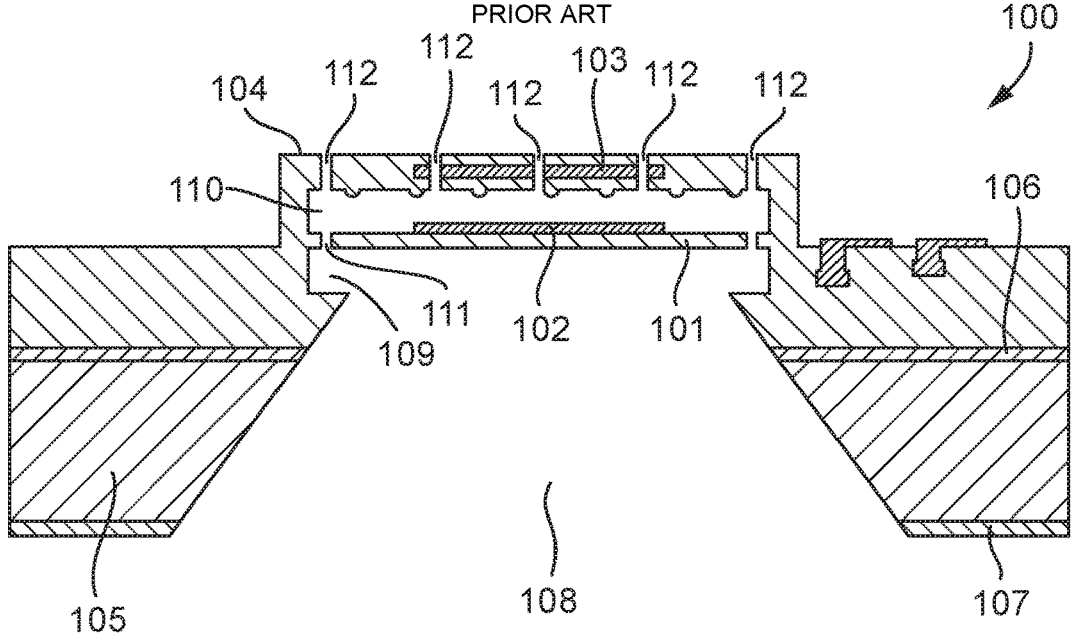
FIGS. 1 and 2 illustrate sectional and perspective views of a known MEMS microphone structure.
Figure 2:
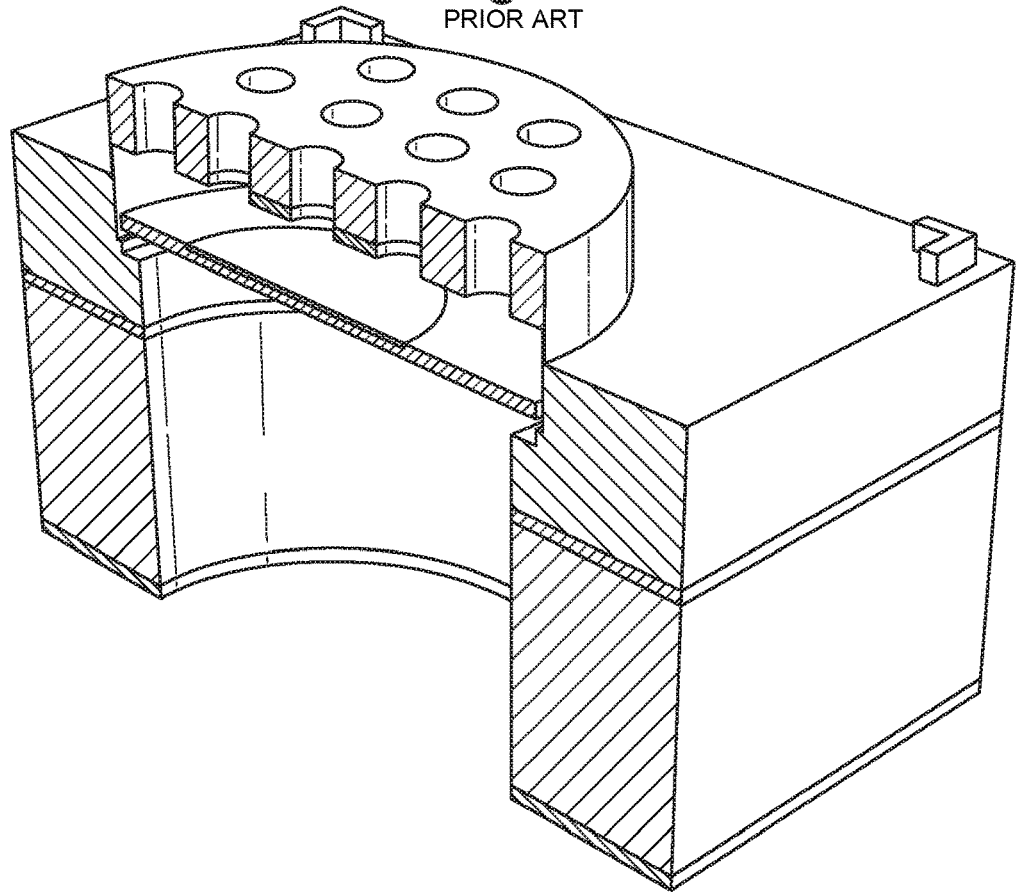
Figure 3:
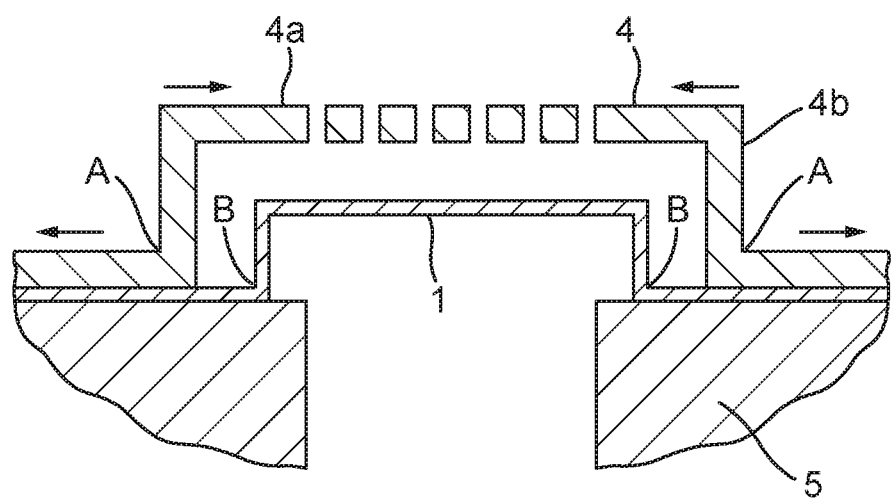
FIG. 3 shows a simplified cross-sectional view of a known MEMS device.
Figure 4A:
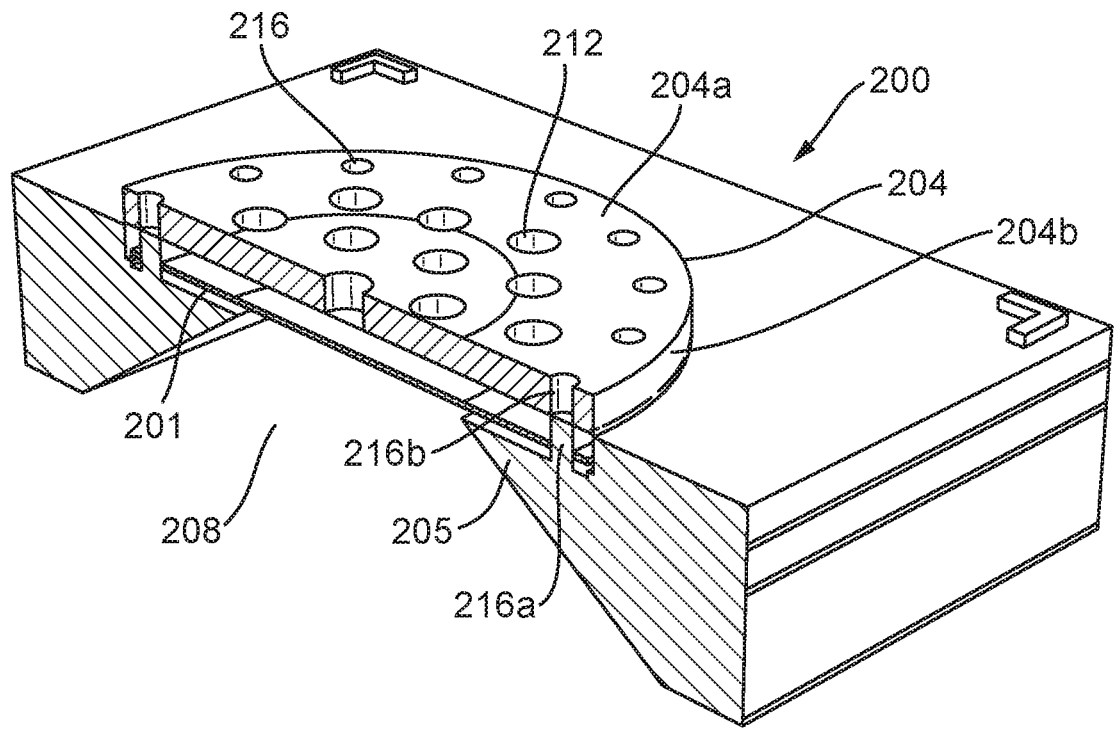
FIGS. 4a and 4b illustrate a previously proposed MEMS transducer having a plurality of support structures.
Figure 4B:
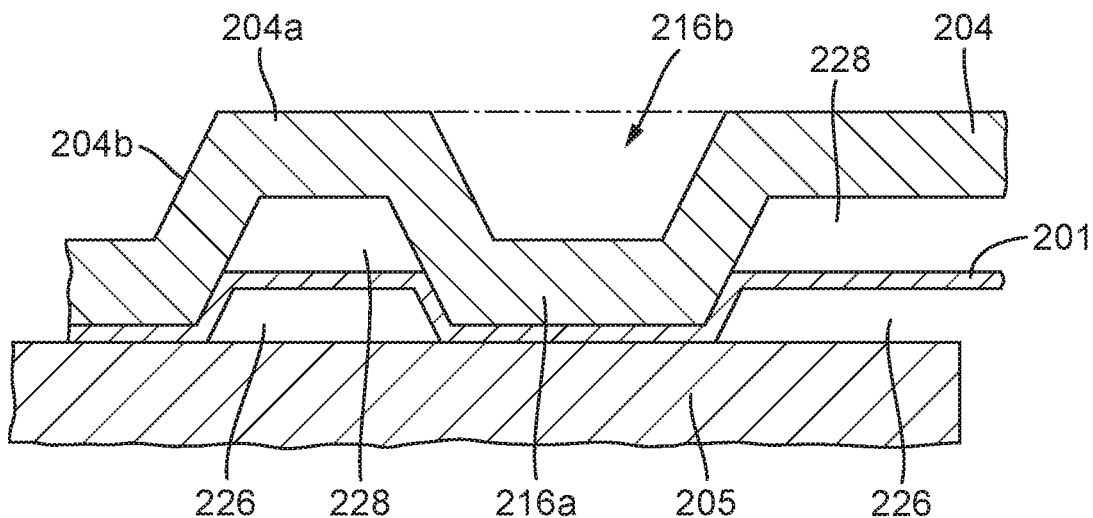

FIG. 4b shows a schematic cross-sectional illustration of a previously considered MEMS transducer comprising a substantially rigid backplate structure 204 and a membrane layer 201 which is able to move relative to the backplate structure. The backplate structure is supported with respect to a substrate 205 by means of a support structure or column 216 which physically connects the backplate 204 to the upper surface of the substrate 205. In this particular example the backplate is connected to the substrate, in the region of the column, via the intermediate membrane layer 201. Thus, the backplate structure can be considered to comprise a raised portion 204a which extends in a plane above the substrate and a sidewall portion 204b.

The support structure acts to reduce the stress in the backplate structure by reducing the torsional movement in the sidewall portions of the backplate. In effect, the support structures each create a kind of bridge structure within the backplate structure which can be seen in the particular cross-sectional view of FIG. 4b, so that the backplate structure is supported with respect to the substrate at two regions—i.e. at the support structure and at the base of the sidewall, instead of just at the base of the side wall.

As shown in FIG. 4b, the support structure 216 which physically connects the backplate layer to the substrate is formed of the backplate layer itself. Specifically, the backplate layer 204 comprises a depression formed in the raised portion 204a of the backplate layer. The depression can be considered to be a region where the backplate layer is sunken or depressed below the surrounding area of the raised portion of the backplate. As shown in FIG. 4b, the depression serves to connect the backplate layer, and in this example also the membrane layer 201, to the upper surface of the substrate. Thus, the depression can be considered to form a void, or region of absence of the material forming the backplate layer, in the plane of the raised portion of the backplate. The support structure itself can thus be considered to comprise a first part 216a which is formed of the back-plate layer 204 and defines the side walls and the base layer of the column, and a second part 216b which is illustrated below the dashed line and comprises the void region of the depression in which there is an absence of material.

It will be appreciated that FIG. 4b shows a cross section through one support structure which is provided near the periphery of the backplate, laterally outside the region of the substrate cavity. As seen from FIG. 4a it will be appreciated that many cross sectional views through a MEMS transducer as illustrated in FIG. 4a would not intersect a column 216. FIG. 4b shows two gaps 226 and 228. The first gap 226 is between the substrate and the membrane layer, whilst the second gap is between the membrane layer and the backplate. It will be appreciated that the gaps 226 and 228 are linked to one another into an out of the plane of the FIG. 4b illustration, around the column 216.

Figure 5A:
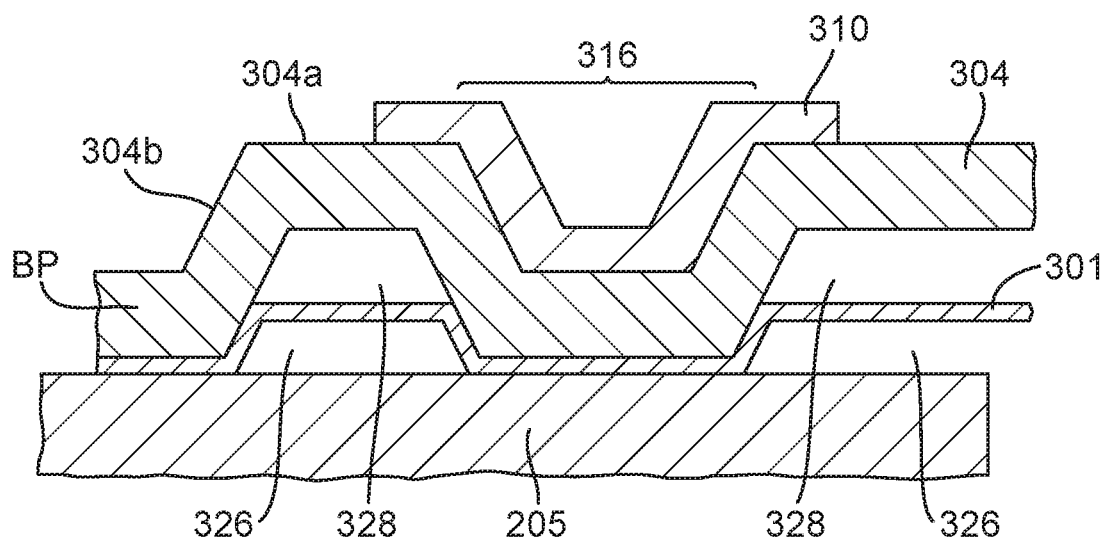
FIG. 5a shows a cross-sectional illustration of a part of a MEMS transducer according to a first example embodiment.

FIG. 5a shows a cross-sectional illustration of a part of a MEMS transducer according to a first example embodiment. The transducer is similar to the example shown in FIG. 4b and comprises a backplate structure 304 supported with respect to a substrate 305, the backplate structure comprising a raised portion 304a and a sidewall portion 304b. The transducer further comprises a membrane layer 301 which is able to move relative to the backplate structure. A support structure or column 316 serves to physically connect the backplate 304 to the upper surface of the substrate 305, via the membrane layer 301. As discussed with respect to FIG. 4b, the support structure 316 can be considered to comprise a depression or dimple formed in the raised portion 204a of the backplate structure which causes a region of the backplate to extend below the plane of the rest of the raised portion in a direction towards the upper surface of the substrate.

According to the present example a strengthening portion 310 is provided in the region of the support structure. The strengthening portion may comprise a layer of relatively rigid material, such as metal or a ceramic material. As illustrated in FIG. 5a the strengthening portion 310 extends from the region of the support structure into a region laterally surrounding the region of the support structure. Thus, in this example the strengthening portion is formed on top of the backplate structure so as to be substantially conformal with an upper surface of the backplate structure. The conformal strengthening layer or conformal strengthening portion, 310 is formed within the depression and extends from the base of the depression, along the side walls of the depression and onto an upper surface of the raised portion of the backplate structure.

The provision of a strengthening portion, or strengthening layer, 310 in the region of the support structure advantageously enhances the strength and rigidity of the backplate structure. In particular, according to examples where the strengthening portion extends into a region surrounding the region of the support structure, the strengthening layer beneficially serves to inhibit relative movement between the support structure, which is connected to the substrate, and the raised portion of the backplate.

Figure 5B:
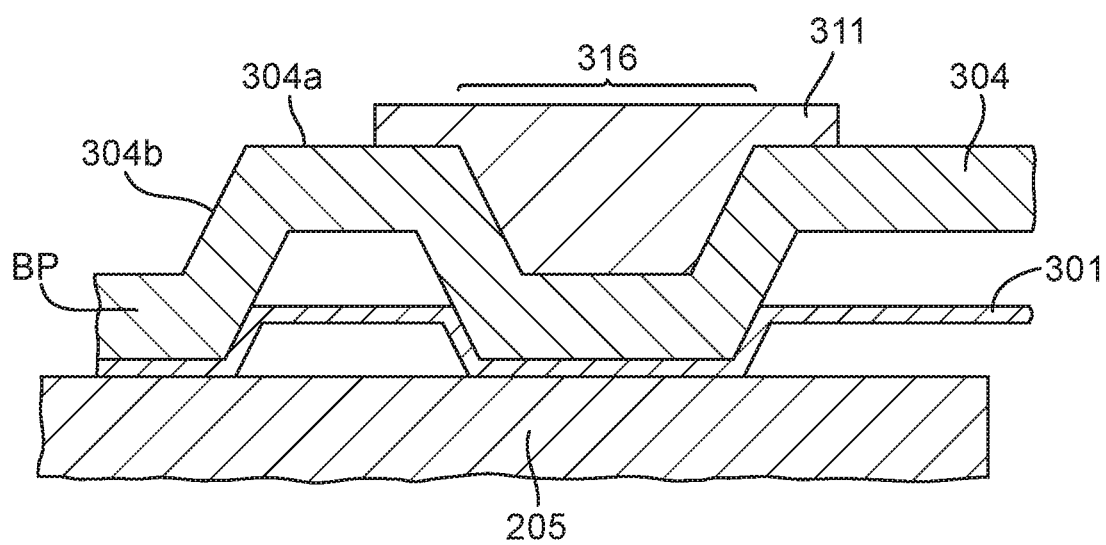
FIG. 5b shows a cross-sectional illustration of a part of a MEMS transducer according to a second example embodiment.

FIG. 5b shows a cross-sectional illustration of a part of a MEMS transducer according to a second example embodiment. The transducer is similar to the example shown in FIG. 5a and comprises a backplate structure 304 supported with respect to a substrate 305 by means of a support structure 316. A strengthening portion 311 is provided in the region of the column 316. In this example the strengthening portion 311 substantially fills, or plugs, the depression formed in the backplate structure which defines the support structure. Such a configuration may provide enhanced rigidity to the backplate structure.

Figure 5C:
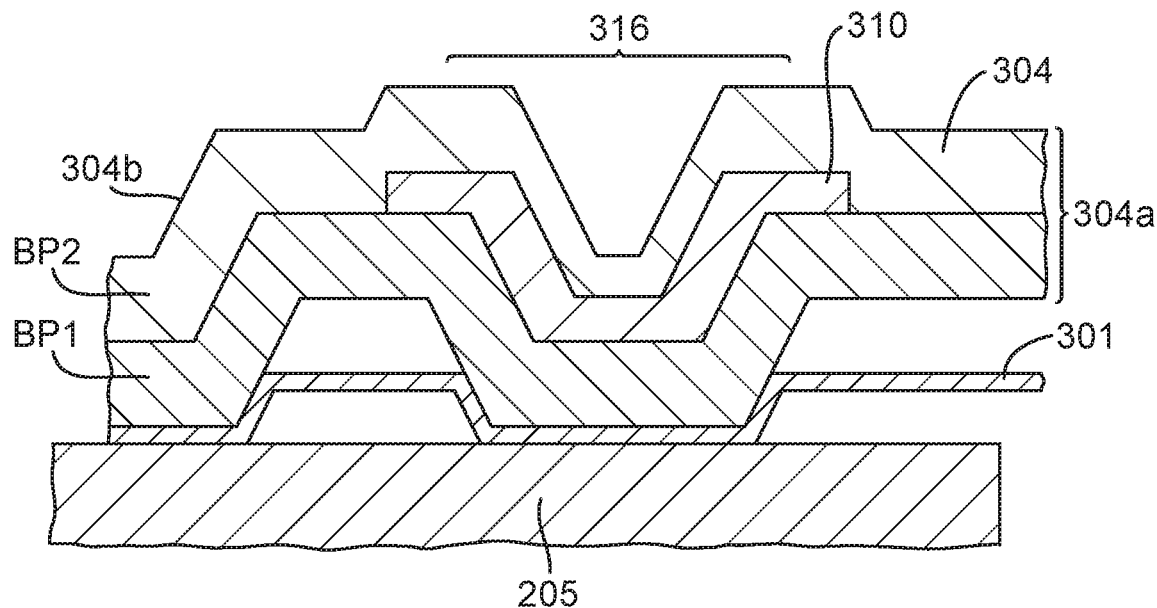
FIG. 5c shows a cross-sectional illustration of a part of a MEMS transducer according to a third example embodiment.

FIG. 5c shows a cross-sectional illustration of a part of a MEMS transducer according to a third example embodiment. In this example the backplate structure is formed from first and second backplate layers 304a and 304b respectively. A support structure 316 is provided which serves to connect the multi-layer backplate structure and the intermediate membrane layer 301 to the upper surface of the substrate. Again, the support structure can be considered to comprise a depression or dimple formed in the raised portion 204a of the multi-layer backplate structure which causes a region of the backplate to extend below the plane of the rest of the raised portion in a direction towards the upper surface of the substrate. According to the present example a strengthening portion 310 is provided between the first and second backplate layers. In this sense, the strengthening portion can be considered to be embedded within the region of the raised portion of the backplate structure which forms the support structure.

During a method of manufacture, the strengthening layer 310 may be deposited so as to substantially conform to the upper surface of the first backplate layer BP1. Then in a subsequent manufacturing step the second backplate layer BP2 is formed on top of the first backplate layer 304a and the conformal strengthening portion, and may therefore substantially conform to the underlying shape of the upper surface of these two layers, as illustrated in FIG. 5c.

Figure 5D:
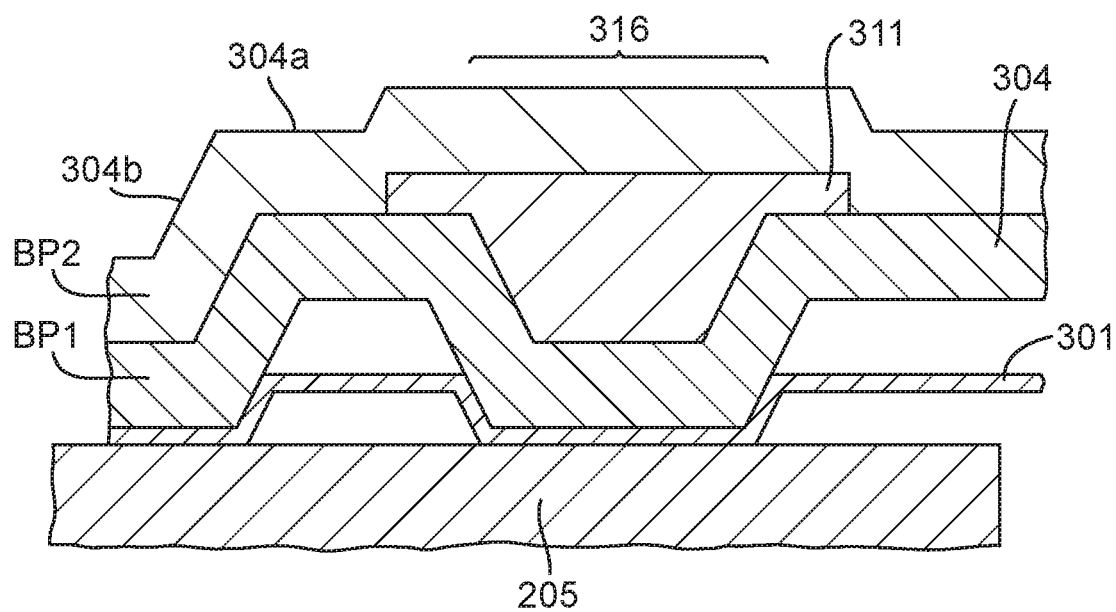
FIG. 5d shows a cross-sectional illustration of a part of a MEMS transducer according to a fourth example embodiment.

FIG. 5d shows a cross-sectional illustration of a part of a MEMS transducer according to a fourth example embodiment. In this example the backplate structure is again formed from first and second backplate layers BP1 and BP2 respectively. According to the present example a strengthening portion 310 is provided between the first and second backplate layers. In this case, the strengthening portion substantially plugs or fills a void formed in the upper surface of the first backplate layer BP1 and is therefore similar to the strengthening portion illustrated in FIG. 5b. In a subsequent step the second backplate layer BP2 is formed, e.g. by deposition, on top of the first backplate layer BP1 and the strengthening portion, giving rise to a support structure which defines a depression or dip in the lower base plate layer such that the lower surface extends down to make contact with the substrate (via the membrane layer 301) but which also defines a projection in the upper base plate layer in a direction above the rest of the plane of the raised portion 304a of the backplate layer.

The backplate structure will typically support a fixed electrode of the MEMS transducer. The material (e.g. metal) layer which forms the backplate electrode may be embedded within the backplate structure and may extend into a peripheral region of the backplate structure and thus into a region of the support structure. For example, a conductive track may be provided which connects the backplate electrode embedded within the raised portion of the backplate electrode to a region laterally outside the transducer structure, for example to an integrated or stand-alone circuitry region provided for processing the measured change in capacitance between the fixed electrode and a membrane electrode supported by the flexible membrane region of the membrane layer. Thus, it will be appreciated that this layer, which may be embedded within the backplate layer of FIG. 5b or within one of the backplate layers shown in FIG. 5c, may form a part of the support structure. The electrode layer will typically be formed of metal.

According to one or more examples, a plurality of support structures are provided in the region at or near the periphery of the raised portion of the backplate structure. The support structures may be provided in a region laterally outside the substrate cavity and laterally inside a boundary defined by the sidewall portion of the backplate.

The arrangement of support structures around the periphery of the backplate structure may also connect or pin the membrane layer to the substrate. Thus, references to the support structure connecting the backplate structure to the substrate, or to the (lower surface of) the backplate structure being in contact with the substrate should not be interpreted as implying that the support structure or backplate structure is in direct contact with the substrate. For example, one or more other layers, such as a membrane layer, may be interposed between the substrate and the support structure which comprises the backplate. It will be appreciated that the provision of a plurality of support structures can be considered to define a boundary of an active region of the membrane, the active membrane region being the region that moves or flexes in response to a pressure differential across the membrane. Thus, according to one or more of the examples described herein, the active membrane region may be defined inside the perimeter of the overall membrane layer.

A number of methods are envisaged for fabricating transducer structures according the present examples. With reference to FIGS. 6a to 6g a number of preliminary steps will now be described, which are also explained in United Kingdom Patent Application No. GB2453105, which may be performed in order to produce a structure similar to that illustrated in FIG. 4b.

Figure 6A:
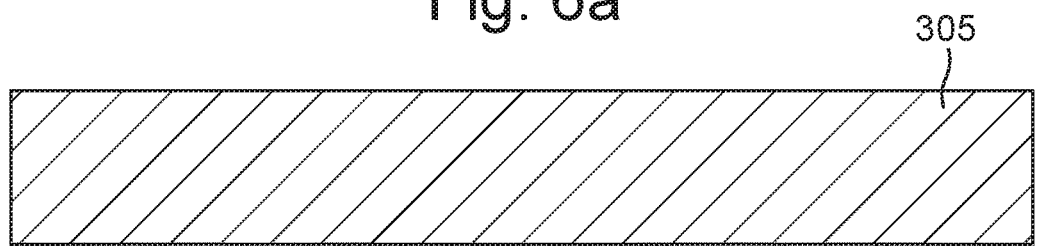
FIGS. 6a to 6g illustrate a number of fabrication steps for producing a structure similar to that illustrated in FIG. 4b.

FIG. 6a shows a substrate 305 which may be e.g. silicon, or any other suitable material.

Figure 6B:
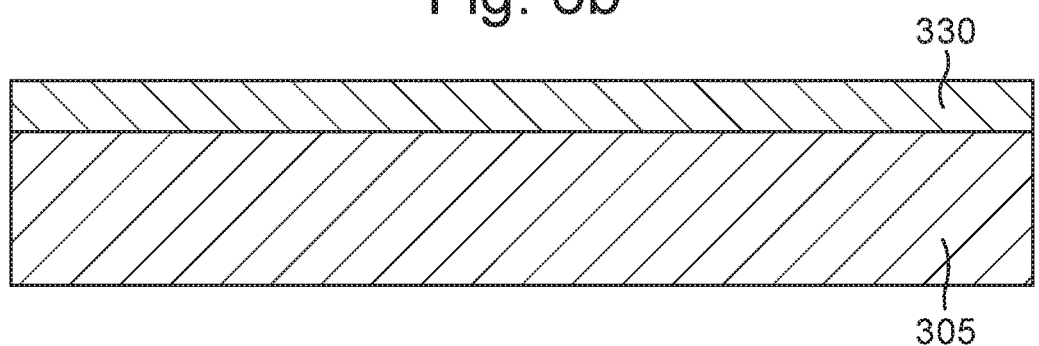

A first step in the process is to deposit a layer 330 on to the substrate 305 (see FIG. 6b). For example, the layer 330 may be an etch stop layer, for example an etch stop polyimide.

Figure 6C:
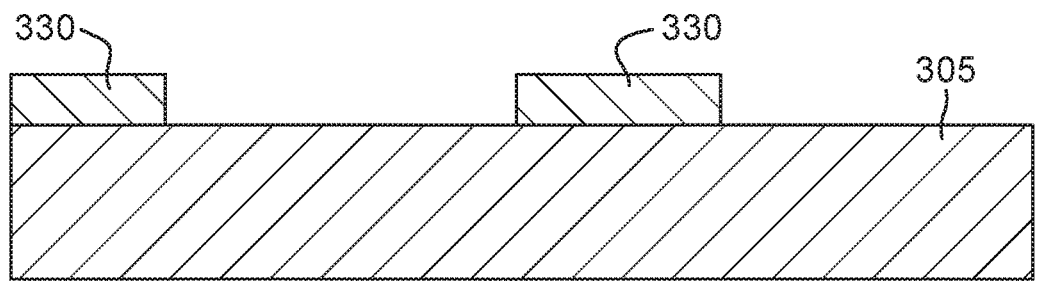

A next step in the process is to pattern the polyimide layer 330 appropriately (see FIG. 6c). The polyimide layer 130 is patterned such that one or more spaces are left on the substrate 305 at selected points around the device, these points defining the positions of support structure 316. FIG. 6c shows two portions, both labelled as the polyimide layer 330. However, in reality these portions are connected out of the plane of the cross-section. In other words, the gap shown between the portions 130 in FIG. 6c defines a closed shape, such as a circle, in plan view.

The patterning may take place through dry or wet etching, or any other process that appropriately removes the polyimide layer 330 without damaging the device.

Figure 6D:
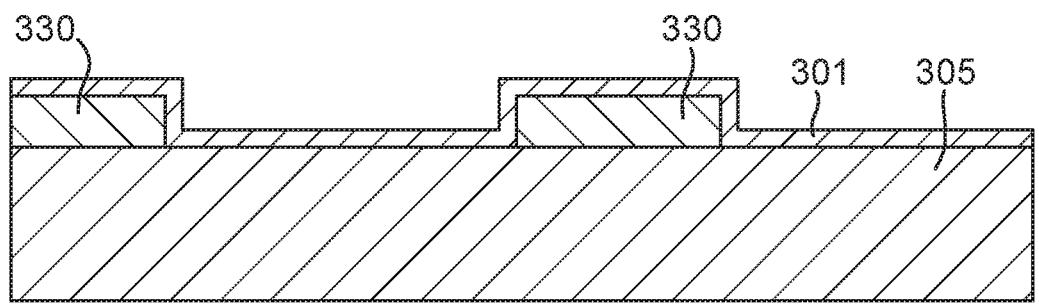

A next step in the process is to deposit the membrane layer 301 (see FIG. 6d). The membrane layer 301 may be silicon nitride or any other suitable material. As afore-mentioned, the membrane layer 301 must be flexible enough to respond to acoustic waves, but strong enough not to sag in the middle of the device.

Optionally, the membrane layer 301 may be patterned to form small "release" holes above the area of polyimide layer 330 between the column 316 and the prospective position of the sidewall of the back-plate structure 304 (not shown). The release holes would allow etchant to flow more easily to the area of the polyimide layer between the column and the sidewall, such that the polyimide layer is removed more effectively.

Figure 6E:
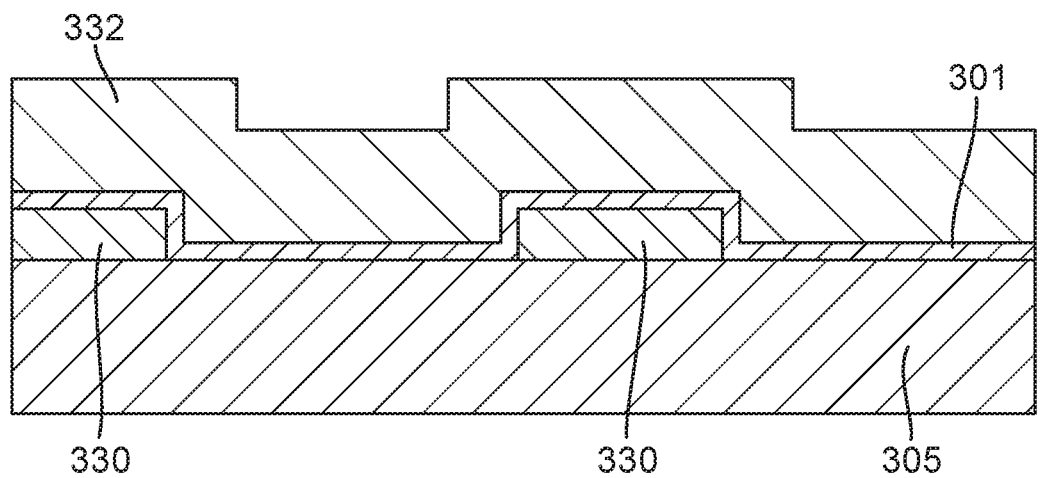

A next step in the process is to deposit a sacrificial layer 332, for example a polyimide layer 332 on top of the membrane layer 301 (see FIG. 6e). The sacrificial layer 332 substantially conforms to the shape of the membrane layer 301 underneath.

Figure 6F:
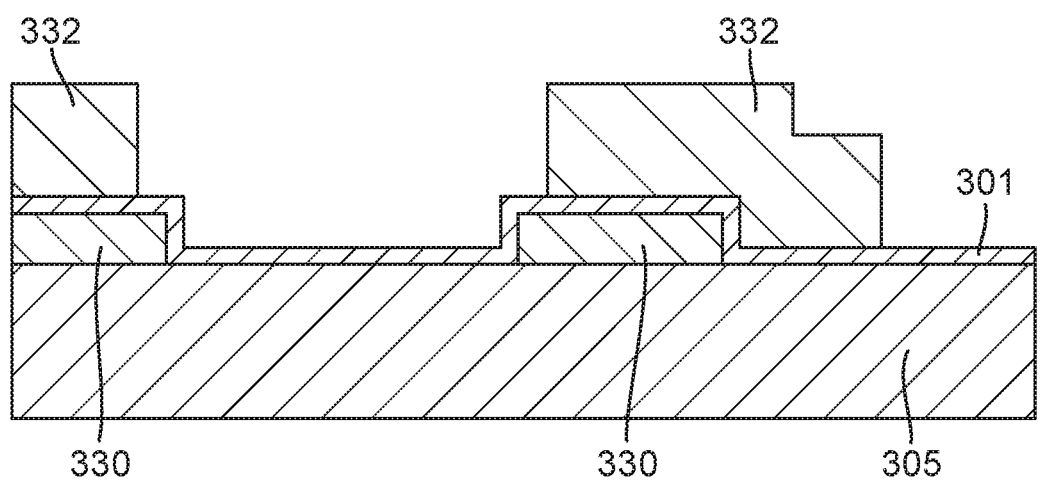

In FIG. 6f, the sacrificial polyimide layer 332 is patterned, such that the sacrificial polyimide layer 332 forms a stepped structure, the stepped structure subsequently defining a stepped structure in the backplate structure 304 (not shown). The patterning involves removing the sacrificial polyimide layer 332 from the locations that have been marked for columns, i.e. substantially the positions in which the first etch stop polyimide layer 330 was etched away.

Figure 6G:
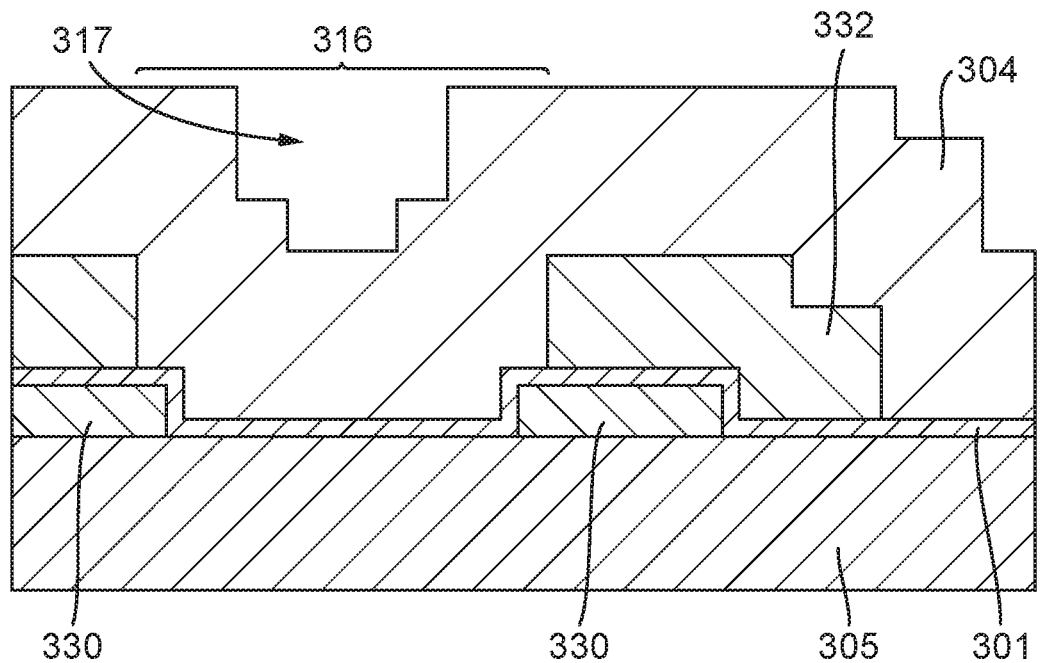

A next step of the process is to deposit the back-plate layer 304 (see FIG. 6g). In use, the back-plate acts as a fixed reference against which the displacement of the membrane layer 301 varies. Therefore the back-plate layer 110 should be rigid and so, it can be seen that the backplate layer 304 is thicker than the membrane layer 301. The back-plate layer 304 fills the recess left by the patterning of the two polyimide layers 330, 332, and forms the support structure 316, or column, in conjunction with the membrane layer 301. The back-plate layer 304 may be silicon nitride or any other suitable material familiar to those skilled in the art. The support structure thus comprises a first part which comprises a portion of the membrane layer 301 and a portion of the backplate layer 304, and a second part or void which defines a depression or dip 317 formed in the upper surface of the backplate structure.

Optionally, the back-plate layer 304 may be patterned to form small "release" holes above the area of polyimide layer 332 between the column 316 and the position of the sidewall of the back-plate structure. The release holes would allow etchant to flow more easily to the area of the polyimide layer between the column and the sidewall, such that the polyimide layer is removed more effectively.

As a final step (not shown), the remains of the polyimide layers 330, 332 are etched away, so that the membrane 301 is free to move relative to the back-plate 304. The etchant (possibly a gas or a liquid) flows though the acoustic holes 212 and/or the release holes mentioned above to etch away the remaining polyimide layers 330, 332 and create the gaps 326, 328 respectively.

Figure 6H:
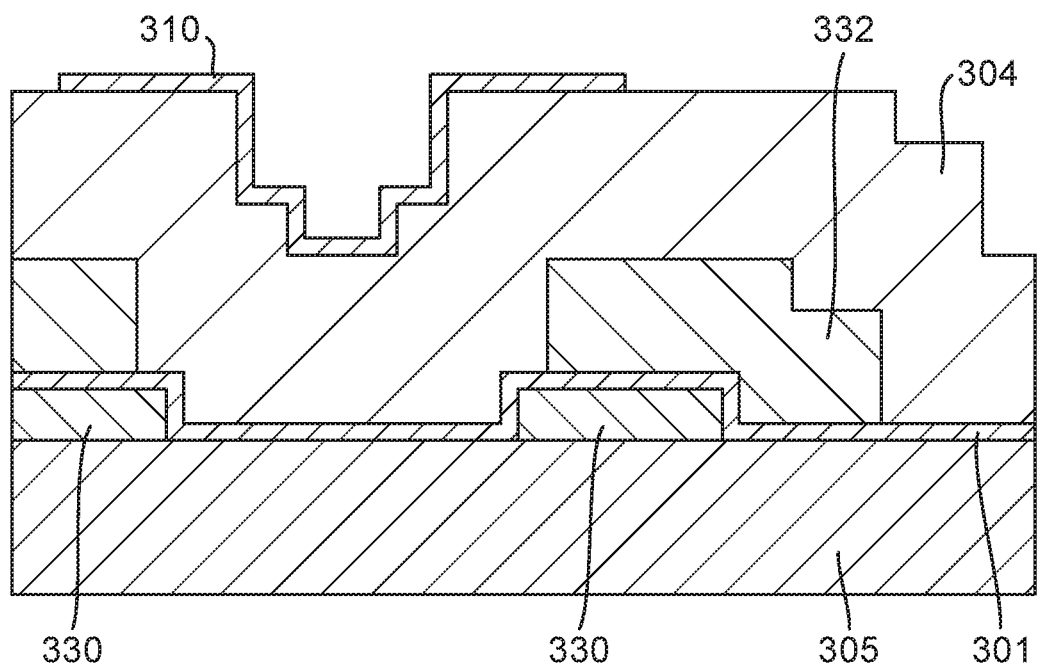
FIG. 6h illustrates a manufacturing step for forming a strengthening portion according to an example embodiment.

In addition, as illustrated by FIG. 6h and according to an embodiment of one example of the present invention, a method of manufacturing a MEMS device additionally involves the formation of a strengthening portion 310 in the region of the dip 317 of the support structure 316. Specifically, in this example a metal layer is deposited which substantially conforms to the upper surface of the backplate structure 304 in the region of the dip 317.

In the examples shown in FIGS. 5a to 5d, metal such as aluminium is deposited from a region above the backplate structure into the depression or dip that is formed within the raised portion 304a of the backplate structure, or within a raised portion of first backplate layer BP1. The metal may be deposited so as to provide a layer of relatively rigid material which substantially conforms to the upper surface of the depression and may, optionally, extend into a region laterally surrounding the region of the depression. In the case of a multi-layer baseplate structure, one or more additional backplate layers may be deposited onto the first backplate layer and previously formed strengthening portion, such that the strengthening portions becomes embedded within the raised portion of the backplate structure as illustrated in FIGS. 5c and 5d.

The support structures may define a cross section which is generally circular in shape. However, it will be appreciated that numerous alternative shapes are envisaged. For example, the support structure may define a generally D-shaped cross section or a T-shaped cross section. The shape of a given support structure may advantageously be selected depending on the overall design of the transducer structure, including e.g. shape of the membrane and the location of the supporting structures.

The membrane may be formed so as to be supported around substantially the whole of its periphery. The membrane can therefore be thought of as being under tension, akin to a drum skin stretched over a frame. To provide uniform behaviour and even stress distribution the membrane may be supported and constrained on all sides and may thus be formed as a generally circular structure. In this case, support structures and associated strengthening portions which serve to connect the backplate structure, the membrane layer and the substrate may be provided at regular intervals all the way around the structure.

Whilst this type of process produces good device properties the use of circular membranes tends to result in some inefficiency in the use of the silicon wafer.

For various reasons it is most usual and/or cost effective to process areas of silicon in generally rectangular blocks of area. Thus the area on a silicon wafer that is designated for the MEMS transducer is typically generally square or rectangular in shape. This area needs to be large enough to encompass the generally circular transducer structure. This tends to be inefficient in terms of use of the silicon wafer as the corner regions of this designated transducer area are effectively unused. This limits the number of transducer structures and circuits that can be fabricated on a given wafer. It would of course be possible to fit more transducers on a wafer by reducing the size of the transducer but this would have any impact on resulting sensitivity and thus is undesirable.

In one or more of the present examples the transducer is based on a design that more efficiency utilises a generally rectangular or square area. This design requires less area for a given transducer sensitivity than an equivalent circular design.

Figure 7:
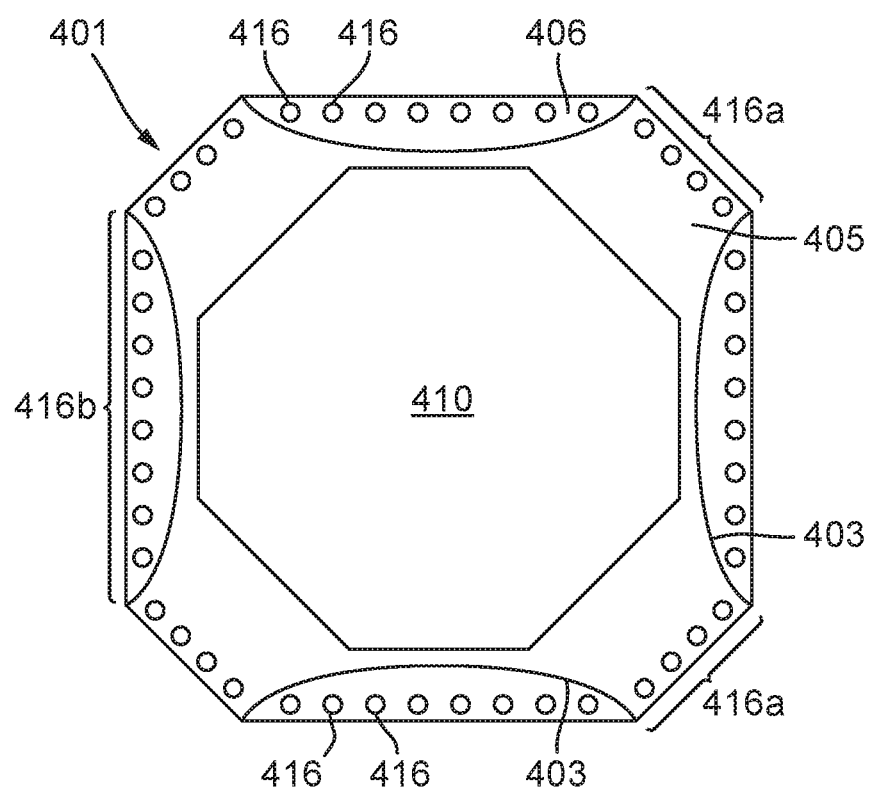
FIG. 7 illustrates an example of a transducer in which the membrane layer has a polygon shape.

FIG. 7 illustrates an example of a transducer in which the membrane layer, instead of being circular, has a polygon shape. In general the membrane has a shape that would substantially fill a square area defined by the perimeter of the membrane. In other words if one were to consider the smallest possible square area that would completely contain the membrane 101 then the membrane would cover a large proportion of such an area, for example the membrane may cover at least 90% of such a square area. It will be appreciated that for a circular membrane of diameter D the smallest such square area would have a side D. The area of the circle ($\pi \cdot D^2/4$) would thus cover about 78% of the area of such a square ($D^2$). The backplate (not shown) has substantially the same shape.

The whole area illustrated in FIG. 7 is provided with a layer of membrane material 401. The layer of membrane material is divided by a plurality of slits 403 into a first membrane region 405, which will be referred to herein as an active membrane region or just as active membrane, and a plurality of second regions 406 which will be referred to as inactive membrane regions or inactive membrane.

The active membrane which is partially defined by the slits 403 thus comprises a central area, e.g. where the membrane electrode will be located, which is supported by a plurality of arms which extend radially from the central region to the edge of the membrane layer. In some examples the arms may be distributed substantially evenly around the periphery of the membrane. A generally even distribution of arms may help avoid unwanted stress concentration. In the example illustrated in FIG. 7 there are four arms and thus four separate regions of inactive membrane 406, but it will be appreciated that there may be more or fewer arms in other embodiments, although preferably there will be at least three arms.

Conveniently during manufacture a continuous layer of membrane material may be deposited and then the channels 403 may be etched through the membrane material to form the active and inactive regions.

The layer of membrane material is supported with respect to the underlying substrate by means of a plurality of support structures 416 which are arranged around the periphery of the membrane layer. The support structures serve to connect the baseplate structure and the membrane layer to the underlying support structure and thus to inhibit relative movement between the substrate and the backplate.

Such a design is advantageous as it provides an active membrane area that has a similar response to a circular membrane with a radius equal to the distance between the centre of the active membrane and the boundary defined by the row of support structures at the periphery of the radially extending arms. However to fabricate such a corresponding circular membrane transducer would require a larger rectangular area of the substrate. By using a design such as illustrated in FIG. 7 the area required for the transducer on a wafer may therefore be reduced compared to a circular membrane of similar performance.

The support structures at the periphery of the active region 405 of the membrane layer may be considered to define a first group 416a of support structures. The support structures at the periphery of the inactive regions of the membrane layer may be considered to define a second group 416b of support structures. According to one or more examples in which the transducer comprises a membrane layer having at least one active region and at least one inactive region, such as the example shown in FIG. 7, it may be advantageous for the first group of support structures which support the active membrane to be of a first design and the second group of support structures which support the inactive membrane to be a different design. For example, the first group of support structures may exhibit a generally circular cross-section, whilst the second group of support structures may exhibit a D or T-shaped cross section.

Figure 8:
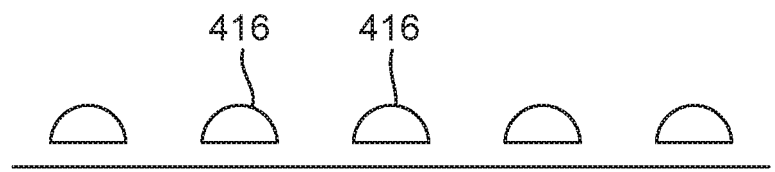
FIG. 8 illustrates a further example in which the closed shape defined by the cross-section of the support structure is D-shaped.

According to one or more examples, and as illustrated in FIG. 8, the support structure may comprise a cross section which exhibits a D shape—i.e. the closed shape defined by the cross-section of the support structure may comprise a straight edge portion and a curved edge portion. In this case, the straight edge portion may be arranged so as to be substantially parallel to the perimeter of the membrane layer whilst the curved edge portion projects generally towards the centre of the membrane layer.

The support structure configurations illustrated in FIG. 8 is particularly applicable when provided in an inactive region of a membrane layer in order to connect the overlaying backplate layer and the intermediate membrane layer to the underlying substrate layer. Such an arrangement may increase the compliance to the support structure.

Figure 9:
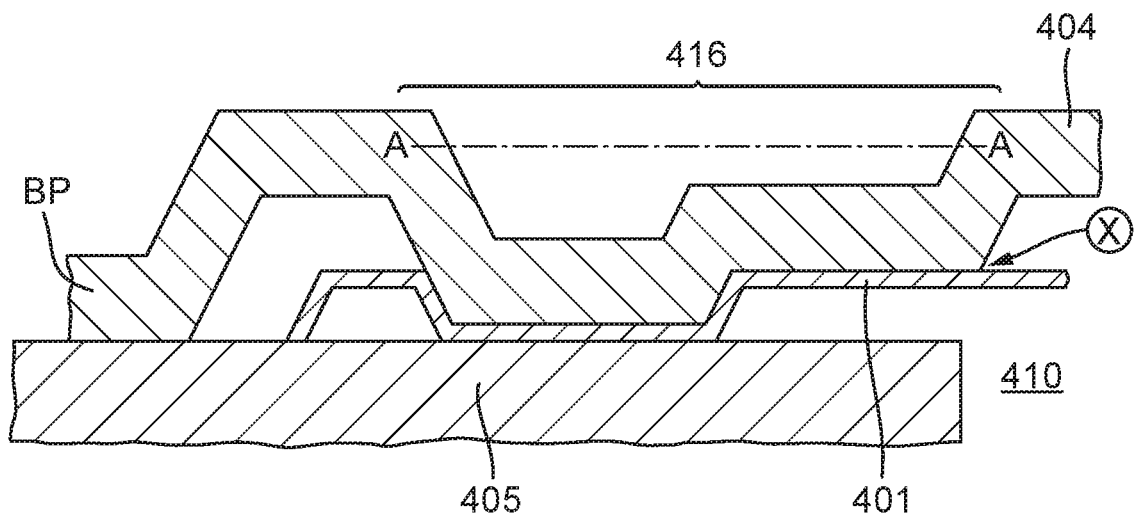
FIG. 9 illustrates part of a MEMS transducer according to a further example embodiment.

FIG. 9 shows a cross-sectional illustration of a part of a MEMS transducer according to a further example. The transducer comprises a backplate structure 404 which is supported with respect to a substrate 405. The transducer further comprises a membrane layer 401—which may be an active region 405 of the membrane or an inactive region of the membrane 406. A support structure or column 416 serves to physically connect the backplate 304 to the upper surface of the substrate 405, via the membrane layer 401. The support structure comprises a depression formed in the raised portion of the backplate structure which causes a region of the backplate to extend below the plane of the rest of the raised portion in a direction towards the upper surface of the substrate. In this example, a cross section of the support structure through the line A-A reveals that the support structure exhibits a D-shape similar to the support structures illustrated in FIG. 8. It will be appreciated that the curved edge portion of the support structure in this example extends beyond the edge of the substrate cavity. This configuration may add additional stresses to the interface region denoted X where the depression formed in the backplate structure makes contact with the top of the membrane.

Figure 10:
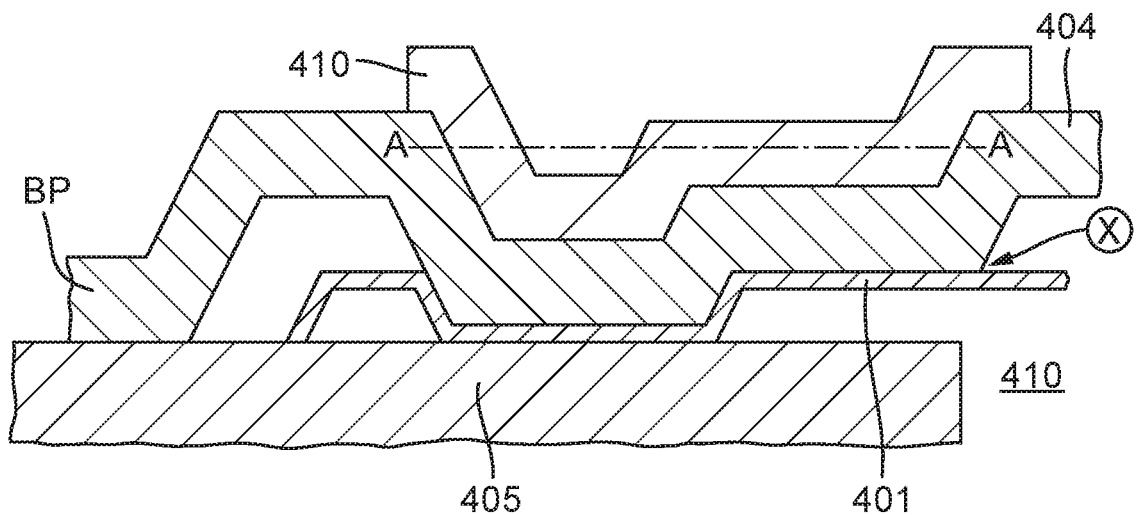
FIG. 10 is a cross-sectional illustration of a part of a MEMS transducer according to a further example embodiment.

FIG. 10 shows a cross-sectional illustration of a part of a MEMS transducer according to a further example embodiment which is similar to the example shown in FIG. 9.

However, according to the present example embodiment a strengthening portion 410 is provided to further enhance the rigidity of the support structure and thus further inhibit movement between the backplate structure and the substrate and/or reducing stresses at the interface region X.

The flexible membrane may comprise a crystalline or polycrystalline material, such as one or more layers of silicon-nitride $Si_3N_4$.

MEMS transducers according to the present examples will typically be associated with circuitry for processing an electrical signal generated as a result of detected movement of the flexible membrane, either by a capacitive sensing technique or by an optical sensing technique. Thus, in order to process an electrical output signal from the microphone, the transducer die/device may have circuit regions that are integrally fabricated using standard CMOS processes on the transducer substrate.

The circuit regions may be fabricated in the CMOS silicon substrate using standard processing techniques such as ion implantation, photomasking, metal deposition and etching. The circuit regions may comprise any circuit operable to interface with a MEMS transducer and process associated signals. For example, one circuit region may be a pre-amplifier connected so as to amplify an output signal from the transducer. In addition another circuit region may be a charge-pump that is used to generate a bias, for example 12 volts, across the two electrodes. This has the effect that changes in the electrode separation (i.e. the capacitive plates of the microphone) change the MEMS microphone capacitance; assuming constant charge, the voltage across the electrodes is correspondingly changed. A pre-amplifier, preferably having high impedance, is used to detect such a change in voltage.

The circuit regions may optionally comprise an analogue-to-digital converter (ADC) to convert the output signal of the microphone or an output signal of the pre-amplifier into a corresponding digital signal, and optionally a digital signal processor to process or part-process such a digital signal. Furthermore, the circuit regions may also comprise a digital-to-analogue converter (DAC) and/or a transmitter/receiver suitable for wireless communication. However, it will be appreciated by one skilled in the art that many other circuit arrangements operable to interface with a MEMS transducer signal and/or associated signals, may be envisaged.

It will also be appreciated that, alternatively, the microphone device may be a hybrid device (for example whereby the electronic circuitry is totally located on a separate integrated circuit, or whereby the electronic circuitry is partly located on the same device as the microphone and partly located on a separate integrated circuit) or a monolithic device (for example whereby the electronic circuitry is fully integrated within the same integrated circuit as the microphone).

Examples described herein may be usefully implemented in a range of different material systems, however the examples described herein are particularly advantageous for MEMS transducers having membrane layers comprising silicon nitride.

One or more MEMS transducers according to the examples described here may be located within a package. This package may have one or more sound ports. A MEMS transducer according to the examples described here may be located within a package together with a separate integrated circuit comprising readout circuitry which may comprise analogue and/or digital circuitry such as a low-noise amplifier, voltage reference and charge pump for providing higher-voltage bias, analogue-to-digital conversion or output digital interface or more complex analogue or digital signal processing.

A MEMS transducer according to the examples described here may be located within a package having a sound port.

It is noted that the example embodiments described above may be used in a range of devices, including, but not limited to: analogue microphones, digital microphones, pressure sensor or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer are provided for each of the example embodiments.

It should be understood that the various relative terms above, below, upper, lower, top, bottom, underside, overlying, underlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

In the examples described above it is noted that references to a transducer may comprise various forms of transducer element. For example, a transducer may be typically mounted on a die and may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:
1. A MEMS transducer comprising:
  a substrate;
  a backplate structure comprising a raised portion provided in a plane above the substrate;
  at least one support structure comprising a depression formed in the raised portion of the backplate structure which connects the backplate structure to the substrate; and
  a strengthening portion provided on an upper surface of the backplate structure in the region of the depression.
2. The MEMS transducer as claimed in claim 1, wherein the strengthening portion is conformal to the upper surface of the backplate structure in the region of the depression.
3. The MEMS transducer as claimed in claim 1, wherein the strengthening portion substantially fills the depression formed in the raised portion of the backplate structure.
4. The MEMS transducer as claimed in claim 1, wherein the strengthening portion is substantially conformal with upper surface of the first backplate layer and/or with the adjacent lower surface of the second backplate layer.
5. The MEMS transducer as claimed in claim 1, wherein the strengthening portion comprises metal.
6. The MEMS transducer as claimed in claim 1, wherein the substrate comprises a cavity and wherein the strengthening portion extends into a region laterally surrounding the region of the support structure.

7. The MEMS transducer as claimed claim 6, wherein the strengthening portion does not extend over a central region of the substrate cavity.

8. The MEMS transducer as claimed in claim 6, wherein the support structure is provided laterally inside a boundary defined by a sidewall portion of the backplate structure and is at least partially in a region laterally outside the substrate cavity.

9. The MEMS transducer as claimed in claim 6, wherein the support structure partially overlies the substrate cavity.

10. The MEMS transducer as claimed in claim 1, further comprising a membrane layer supported relative to the substrate so as to define a flexible membrane region, the membrane layer being provided between the backplate structure and the substrate.

11. The MEMS transducer as claimed in claim 1, further comprising a membrane layer supported relative to the substrate so as to define a flexible membrane region, the membrane layer being provided between the backplate structure and the substrate and wherein the first part of the support structure comprises a portion of the membrane layer.

12. The MEMS transducer as claimed in claim 10, wherein the support structure connects the membrane layer to the substrate.

13. The MEMS transducer as claimed in claim 1, wherein the support structure defines a cross section that is generally D-shaped and comprises a straight edge-portion and a curved edge-portion, and wherein the straight edge-portion is substantially parallel to an adjacent perimeter of the membrane layer.

14. The MEMS transducer as claimed in claim 10, further comprising a membrane electrode supported by the flexible membrane region.

15. An integrated circuit comprising the MEMS transducer as claimed in claim 1 and readout circuitry.

16. A MEMS transducer comprising:
a substrate;
a backplate structure comprising a raised portion provided in a plane above the substrate, wherein the backplate structure comprises a plurality of layers;
at least one support structure comprising a depression formed in the raised portion of the backplate structure which connects the backplate structure to the substrate; and
a strengthening portion provided within the support structure between first and second adjacent backplate layers.

* * * * *